United States Patent [19]

Farkas et al.

[11] 4,009,444
[45] Feb. 22, 1977

[54] PASSIVE RADIO FREQUENCY PEAK POWER MULTIPLIER

[75] Inventors: Zoltan D. Farkas, Menlo Park; Perry B. Wilson, Palo Alto, both of Calif.

[73] Assignee: The United States of America as represented by the United States Energy Research and Development Administration, Washington, D.C.

[22] Filed: Aug. 30, 1974

[21] Appl. No.: 501,911

[52] U.S. Cl. .............................. 328/233; 328/53; 328/59; 343/17.1 R

[51] Int. Cl.² ...................... G01S 7/28; H03K 5/01; H05H 7/02

[58] Field of Search ...................... 328/233–238, 328/53, 59–61; 330/56, 127; 325/163, 164, 160, 126, 125; 331/83; 343/17.1 R, 17.1 PF, 17.2 R, 17.2 PC

[56] References Cited

UNITED STATES PATENTS

| | | | |
|---|---|---|---|
| 2,403,726 | 7/1946 | Lindenblad | 325/129 |
| 2,641,658 | 6/1953 | Priest | 330/56 |
| 2,678,997 | 5/1954 | Darlington | 325/125 X |
| 3,398,376 | 8/1968 | Hirshfield | 330/56 X |
| 3,435,342 | 3/1969 | Burnsweig et al. | 325/163 X |
| 3,649,918 | 3/1972 | Freedman et al. | 330/56 X |

*Primary Examiner*—Siegfried H. Grimm
*Attorney, Agent, or Firm*—Dean E. Carlson; Roger S. Gaither; Clifton E. Clouse, Jr.

[57] ABSTRACT

Peak power multiplication of a radio frequency source by simultaneous charging of two high-Q resonant microwave cavities by applying the source output through a directional coupler to the cavities and then reversing the phase of the source power to the coupler, thereby permitting the power in the cavities to simultaneously discharge through the coupler to the load in combination with power from the source to apply a peak power to the load that is a multiplication of the source peak power.

7 Claims, 10 Drawing Figures

PASSIVE RADIO FREQUENCY PEAK POWER MULTIPLIER

BACKGROUND OF THE INVENTION

The invention disclosed herein was made under, or in the course of Contract No. AT(04-3)-515 with the U.S. Atomic Energy Commission.

The invention relates to peak power multiplication of the power from a radio frequency source, and more particularly, it relates to storing microwave power from the source in resonant cavities and then simultaneously applying the power in the cavities along with the source power to a load.

The usual way of increasing peak microwave power is to use additional or more powerful microwave power sources. However, both of these approaches require more total power, and in either case, the sources are active devices rather than passive and therefore relatively complex and expensive. It is in general desirable, in either large or small microwave systems, to minimize initial capital costs as well as the amount of power consumed during operation of the systems. In particular, to modify an existing very large microwave structure, such as a two-mile linear particle accelerator, to increase its peak power, it is necessary, in order to make such a conversion practical, that the capital cost of the modification and the ensuing operating costs be minimal and within available funding.

SUMMARY OF THE INVENTION

In brief, the present invention pertains to a radio frequency peak power multiplier for multiplying the peak power of a radio frequency source, and includes an input waveguide for receiving radio frequency input power; an output waveguide for delivering radio frequency output power; and passive means coupled to the input waveguide for storing the input power, the passive means being operable upon cessation of the input power for delivering peak power to the output waveguide at a higher level than the input power to the input waveguide.

It is an object of the invention to multiply the peak power of a radio frequency source by means of simple passive devices.

Another object is to minimize the capital cost of equipment used for increasing the peak power of a radio frequency source.

Another object is to minimize the input power required for increasing the output power of a radio frequency source.

Another object is to increase the energy of particle accelerators, radar transmitters and the like by means of simple low-cost passive devices.

Other objects and advantageous features of the invention will be apparent in a description of a specific embodiment thereof, given by way of example only, to enable one skilled in the art to readily practice the invention which is described hereinafter with reference to the accompanying drawings.

DESCRIPTION OF AN EMBODIMENT

Figure 1:
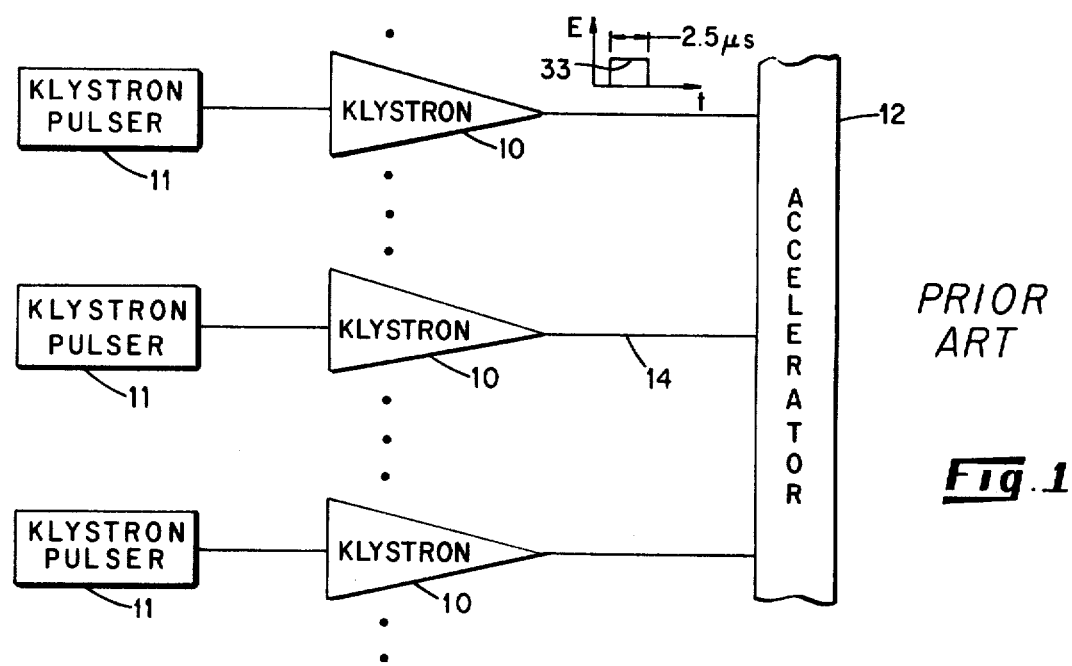
FIG. 1 is a schematic diagram of a prior art arrangement for supplying radio frequency energy from a series of klystrons to successive sections of a linear accelerator through waveguides that connect each klystron to a corresponding accelerator section.
Figure 2:
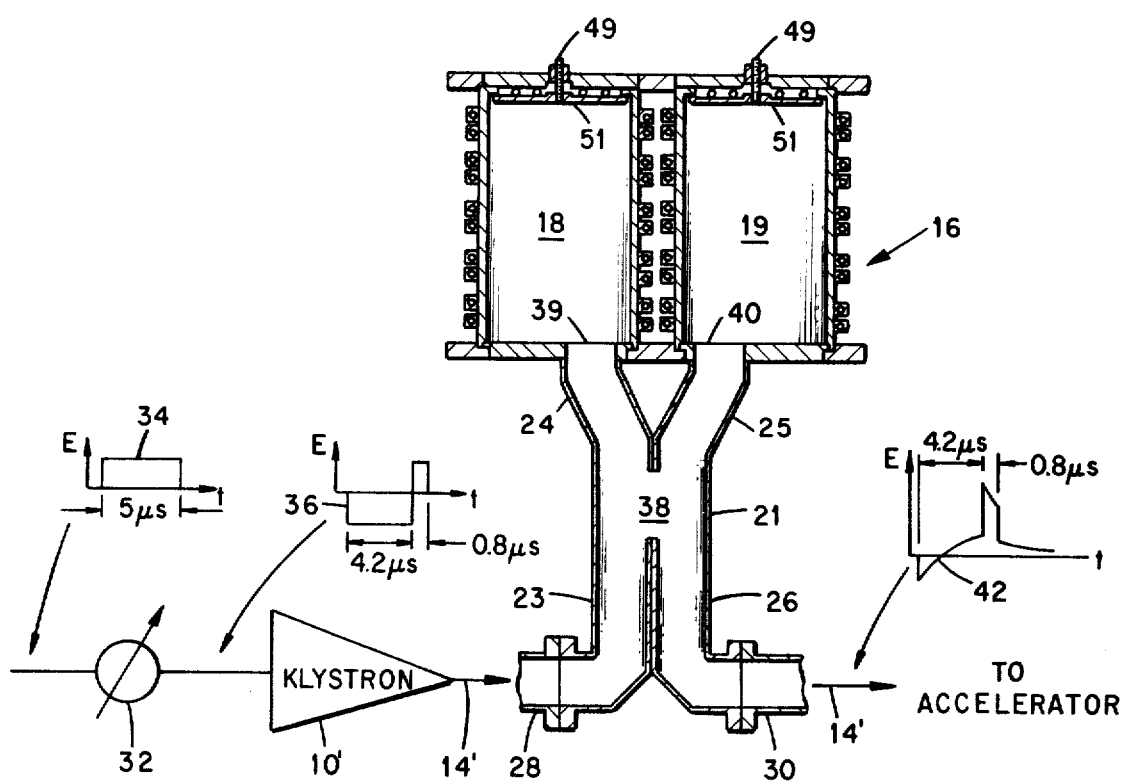
FIG. 2 is a cross-sectional view of an arrangement, according to the invention, including a pair of cavities that are resonant at the frequency of the klystrons of FIG. 1 and which may be serially connected in each waveguide of FIG. 1 between each klystron and the accelerator by means of a directional coupler, for multiplying the peak power of the klystrons.

Referring to the drawing there is shown in FIG. 1 a prior art schematic diagram of a group of klystrons 10 that are pulsed by means of respective klystron pulsers 11 to drive a linear particle accelerator 12 through respective waveguides 14. In FIG. 2 an arrangement 16 is shown serially connected in a waveguide 14' between a klystron 10' and the accelerator 12 for increasing the peak power from the klystron to the accelerator, according to the invention. An arrangement similar to the arrangement 16 may be connected in each of the waveguides 14 to effect a multiplication of the peak power supplied to the accelerator 12 over each of the waveguides 14 to thereby increase the peak energy supplied to the accelerator. The arrangement 16 includes first and second cavities 18 and 19 that are resonant at the frequency of the klystron 10', and a directional coupler 21 having first, second, third and fourth arms 23, 24, 25 and 26, connected respectively to an input waveguide 28, the cavity 18, the cavity 19, and an output waveguide 30. A 180° phase shifter 32 is connected to the input of the klystron 10' for periodically reversing the polarity of power at the klystron 10' output.

It has been determined in making measurements of power radiated from resonant cavities such as cavities 18 and 19 that the power radiated from a cavity that is heavily overcoupled to a radio frequency generator approaches four times the power coupled to the cavities immediately after the generator is switched off. Normally, this radiated power travels as a reverse wave back toward the generator. However, by interconnecting the generator and cavities by means of a directional coupler, such as the coupler 21 which may conveniently be a conventional 3 db coupler, the power radiated from the cavities may be coupled to a load through the coupler, the level of power coupled to the load being a multiple of the power level from the generator, in the limit four times. In addition, by reversing the phase of the generator instead of switching it off, the peak power from such as the arrangement 16 and klystron 10' can be increased by up to a factor of nine, viz, $n + 4n + 4n = 9n$, where $n$ is the peak power level from the klystron 10' and $4n$ is the peak reflected power from each cavity.

In use of the invention in conjunction with a long linear accelerator such as the two-mile linear accelerator at the Stanford Linear Accelerator Center, Stanford, California, a 2.5 $\mu$sec RF pulse 33 (FIG. 1) is applied from each klystron 10 through a waveguide 14 to a corresponding section of the accelerator 12. To double the energy of such an accelerator, the waveguide 14 may be separated near the associated klystron and the arrangement 16 inserted so as to be in series with the waveguide. Power multiplication to accomplish such energy doubling results in a reduced pulse width since the power radiated from each cavity decays with a time constant that is characteristic of the cavity filling time. However, since the energy of the accelerator is determined by the peak RF frequency input power, and since many experiments are not limited by average beam power, increasing peak RF power by reducing RF pulse width without increasing the average input power is a satisfactory way of increasing the energy of the accelerator. In operation of the invention with the accelerator, the cavities 18 and 19 (FIG. 2) are made to be substantially identical and tuned to resonance at the frequency of the klystron 10'. Upon application of a control pulse 34 having a pulse width of 5 $\mu$sec, twice the width of the pulse 33, to the phase shifter 32, a pulse 36 is developed having a 4.2 $\mu$sec negative phase and a 0.8 $\mu$sec positive phase. A pulse similar in phase to the pulse 36 but at a higher power level appears at the output of the klystron 10' and is applied through the input waveguide 28 to the first arm 23 of the directional coupler. A coupling aperture 38 is centrally located within the coupler 21 and is of such dimensions as to evenly couple the power of the first phase of the klystron pulse through the second and third arms 24 and 25 to the cavities 18 and 19 through respective coupling apertures 39 and 40. The resulting fields in the cavities build up during the negative phase of the pulse 36 until a wave of increasing amplitude is radiated from the cavities through respective coupling apertures 39 and 40. The two emitted waves combine at the aperture 38 so as to add in the fourth arm 26 to the accelerator and cancel in the first arm 23 to the klystron 10. In addition to the waves emitted from the cavities, a wave travels directly from the klystron to the accelerator. This direct wave, which is just the wave that would appear at the accelerator if both cavities were detuned, is opposite in phase to the combined emitted waves. If the cavities are overcoupled, the emitted waves grow in time to an amplitude which is larger than the direct wave. The net field at the input to the accelerator is a wave 42 which is the sum of the direct and emitted waves. The wave 42 goes through a phase reversal at the beginning of one accelerator filling time (0.8 $\mu$sec) before the end of the RF pulse from the klystron 10' when the phase shifter 32 reverses the phase of the output wave from the klystron. Immediately after this phase reversal, the emitted and direct waves add in phase in the output waveguide 30, since the emitted waves (which are proportional to the stored fields in the cavities) cannot change instantaneously. Therefore, when the klystron phase is reversed, the field at the input to the accelerator increases by two units (assigning one unit to the direct wave), since at any instant the load wave is the sum of the direct and emitted waves. Following the phase reversal, the fields in the cavities (and hence the emitted waves also) decrease rapidly as the cavities try to charge up to a new field level of opposite phase. The resultant wave 42 at the accelerator decreases also. At the end of the pulse 36, the direct wave goes to zero and the emitted wave only is present at the accelerator. It then decays to zero with a time constant that is characteristic of the cavity filling time.

In order to understand the theory of an energy doubler in detail, consider the transient behavior of the reflected and stored fields for a single resonant cavity. The field which would normally be reflected back toward an RF generator in the case of a single resonant cavity may be directed into a load by means of the arrangement 16. In analyzing the behavior of a single cavity, it is convenient to consider the net reflected field as the superposition of a wave $E_e$ emitted from the coupling aperture 38 and a reverse wave $E_K$ which is equal in magnitude to an incident wave $E_i$ from the generator (klystron), and which is reflected from the waveguide-cavity interface with a 180°-phase reversal. If at any instant the generator is turned off, the field traveling away from the cavity is equal to $E_e$, which in turn is proportional to the stored field inside the cavity at that time. If, on the other hand, at any instant the cavity could be emptied of stored energy (by, for example, instantaneously detuning it) then the reverse wave traveling back toward the generator would be just $E_K$. By conservation of power, $$P_K = P_L + P_c + dW_c/dt,$$

where $P_K$ is the incident power, $P_L$ is the net reflected power (the power delivered to the load in the case of the arrangement 16 shown in FIG. 2), $P_c$ is the power dissipated in the cavity and $W_c$ is the energy stored in the cavity at time $t$. Using $P_c = \omega W_c/Q_o$, where $Q_o$ is together with the fact that power is proportional to the square of the field, ($P = kE^2$), where $k$ in the above relation becomes $$E_K^2 = (E_e + E_K)^2 + E_e^2/\beta + (2Q_o/\omega\beta)E_e dE_e/dt.$$

A cavity coupling coefficient $\beta$ has also been defined, such that $kE_e^2 = \beta P_c$. If at any instant the generator is turned off, $\beta$ is given by the ratio of the power emitted from the coupling aperture to the power dissipated in the cavity walls. If we now introduce the cavity filling time $T_c = 2Q_L/\omega = 2Q_o/[\omega(1+\beta)]$, where $Q_L$ is the preceding expression can be rearranged to give $$T_c\, dE_e/dt + E_e = -\alpha E_K, \qquad (1)$$

where $\alpha = 2\beta/(1 + \beta)$.

Figure 3A:
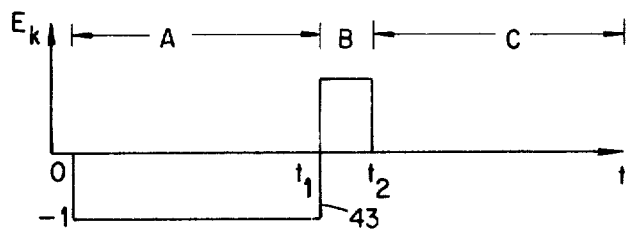
FIGS. 3A, 3B, 3C, 3D and 3E are a series of diagrams showing waveforms that occur in the arrangement of FIG. 2.
Figure 3B:
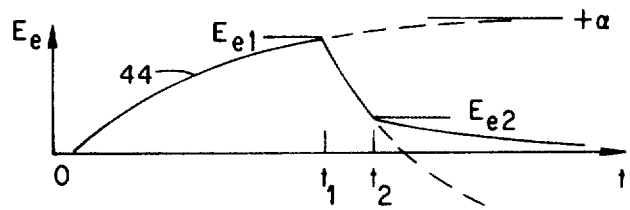
Figure 3C:
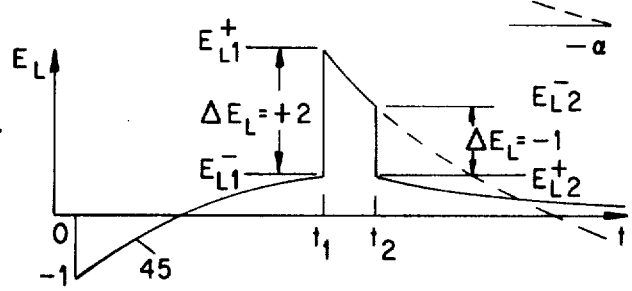

Equation (1) can now be solved for the generator waveform $E_K$ shown in FIG. 3A as waveform 43. For convenience, we take $E_e$ to be initially positive, and since initially $E_e$ and $E_K$ must be opposite in phase, we take $E_K$ to be $-1$. At time $t_1$ the phase of the generator wave is reversed, and $E_K = +1$. At time $t_2$ the incident power is turned off. By solving Eq. (1), the following expressions for the emitted field in the three time intervals $A$, $B$ and $C$ shown in FIG. 3 are obtained:

$$E_e(A) = -\alpha e^{-\tau} + \alpha\; ; \; E_{e_1} = -\alpha e^{-\tau_1} + \alpha\; ; \qquad (2a)$$

$$E_e(B) = \gamma e^{-(\tau-\tau_1)} - \alpha\; ; \; E_{e_2} = \gamma e^{-(\tau_2-\tau_1)} - \alpha\; ; \qquad (2b)$$

$$E_e(C) = E_{e_2} e^{-(\tau-\tau_2)} \qquad (2c)$$

where $\tau = t/T_c$, $\gamma = \alpha(2-e^{-\tau_1})$, $e$ is the electronic charge and $E_{e1}$ and $E_{e2}$ are the values of $E_e$ at $t_1$ and $t_2$. The variation in $E_e$ as a function of time is shown in FIG. 3B as waveform 44, for the case $\beta = 5$, $\tau_1 = 2$ and $\tau_2 = 2.4$. The load waveform, given by $E_L = E_K + E_e$, is shown in FIG. 3C as waveform 45. The load fields are:

$$E_L(A) = E_s(A) - 1 = -\alpha e^{-\tau} + (\alpha - 1) \quad (3a)$$

$$E_L(B) = E_s(B) + 1 = \gamma e^{-(\tau-\tau_1)} - (\alpha - 1) \quad (3b)$$

$$E_L(C) = E_s(C) = [\gamma e^{-(\tau_2-\tau_1)} - \alpha] e^{-(\tau-\tau_2)} \quad (3c)$$

The field on a traveling-wave constant-gradient accelerating section is given by $E(z,t) = E[o, t - \Delta t(z)]$, where $\Delta t(z)$ is the length of time it takes for a wave to propagate from the input of the structure to position $z$ on the structure. For a constant-gradient structure, in which the group velocity $v_g$ varies linearly with $z$ according to $v_g(z) = v_{g0}(1 - gz/L)$, the propagation time to position $z$ is given by $$\Delta t(z) = \int_0^z \frac{dz}{v_g(z)} = \int_0^z \frac{dz}{v_{g0}(1-gz/L)}.$$

Defining $z' = z/L$, where $L$ is the length of the accelerating structure, and integrating the above expression, we obtain $$\Delta t(z') = T_a[ln(1-gz')/ln(1-g)] \quad (4)$$

where $T_a = \Delta t(1) = (L/gv_{g0})ln[1/(1-g)]$ is the filling time for the structure and $g$ is a constant of the accelerator section and it defines the variation of group velocity along the accelerator. The field $E(z,T)$ along the structure is now obtained by substituting $t - T_a[ln(1-gz')/ln(1-g)]$ for $t$ in Eqs. (3). The result is:

$$E(A) = -\alpha e^{-\tau} f(z') + (\alpha - 1) \quad (5a)$$

$$E(B) = \gamma e^{-(\tau-\tau_1)} f(z') - (\alpha - 1) \quad (5b)$$

$$E(C) = [\gamma e^{-(\tau_2-\tau_1)} - \alpha] e^{-(\tau-\tau_2)} f(z') \quad (5c)$$

where $f(z') = (1-gz')^\nu$ and $\nu = (T_a/T_c)[ln(1-g)]^{-1}$.
In using these relations, the fact must be taken into account that there are discontinuities in the field along the accelerating structure corresponding to discontinuities at times $t_d=0$, $t_1$ and $t_2$ in the field as a function of time at the input to the structure. In general, a field discontinuity will occur at a position $z_d'$ along the structure for a discontinuity at time $t_d$ in the waveform at $z=0$, where $$z_d' = (1/g) [1 - (1-g)^{t' - t_d'}]. \quad (6)$$

This expression is obtained by solving Eq. (4) for $z'$, defining also a normalized time by $t' = t/T_a$, and setting $\Delta t = t - t_d$. For example, in the time interval $0 < t < t_1$, the field is zero for $z' > z_d'$, where $z_d'$ is obtained using $t_d'=0$ in Eq. (6). For $z' < z_d'$, the field is given by Eq. (5a).

The accelerating voltage is now obtained by integrating the field from $z'=0$ to $z'=1$, taking into account the location of the field discontinuities and using the appropriate fields given by Eqs. (5) up to and following each discontinuity. Thus the energy gain V for the interval $t_1 < t < t_2$ is given by $$V = \int_0^{z_{d_1}'} E(B) dz' + \int_{z_{d_1}'}^1 E(A) dz',$$

where $z_{d1}'$ is given by Eq. (6) with $t_d' = t_1'$. The energy gain is by definition unity after one filling time for a direct wave $E_K = 1$, which would be present with the cavities detuned. Since $f(z')$ is common to all of the energy gain integrals, the calculation is simplified by defining $$F_1(z_d') = \int_0^{z_d'} f(z')dz' = [1 - (1-gz_d')^{1+\nu}] [g(1+\nu)]^{-1};$$

$$F_2(z_d') = \int_{z_d'}^1 f(z')dz' = [(1-gz_d')^{1+\nu} - (1-g)^{1+\nu}] [g(1+\nu)]^{-1}.$$

Thus, during $t_1 < t < t_2$, $$V = \gamma e^{-(\tau-\tau_1)} F_1(z_{d_1}') - (\alpha - 1) z_{d_1}'$$
$$-\alpha e^{-\tau} F_2(z_{d_1}') + (\alpha - 1)(1 - z_{d_1}')$$

Figure 3D:
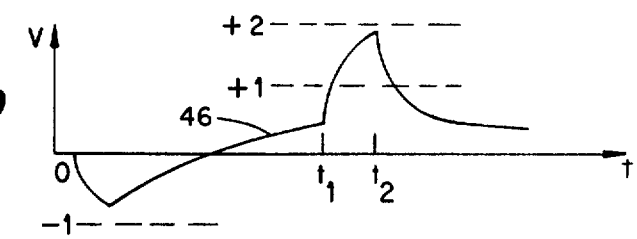

Similar expressions can be derived for time intervals A and C. A plot of the normalized energy gain as a function of time is shown in FIG. 3D as curve 46. The maximum energy is obtained after one filling time, by letting $t=t_1+T_a$ (or $t'=t_1' + 1$) and $z_{d1}' = 1$. For this special case, $$V_{max} = M = \gamma e^{-\tau_a} \tau_r [1 - (1-g)^{1+\nu}][g(1+\nu)]^{-1} - (\alpha-1),$$

where $M$ is the energy multiplication factor.

Figure 3E:
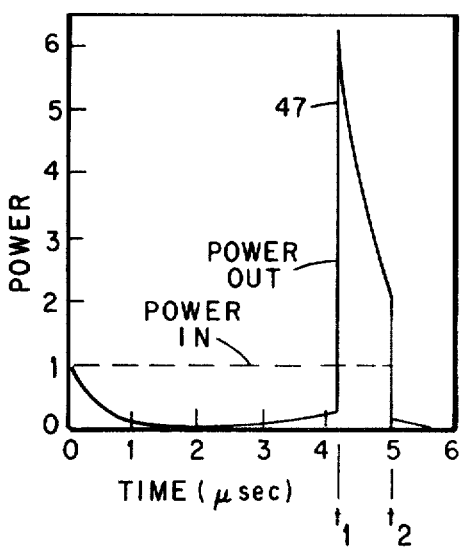

As a result of a number of practical and economic considerations, parameters selected that have been found to be appropriate for energy doubling at the Stanford Linear Accelerator are $Q_o = 10^5$, $t_2$ 5.0 $\mu$sec and $\beta \approx 4.5$. The energy multiplication factor for these values is 1.78 as indicated in FIG. 3D during the period $t_1$ to $t_2$. The RF power output from the microwave network shown in FIG. 2 is shown in FIG. 3E as a curve 47 as a function of time for the selected parameters; and, as indicated by the width of the curve 47 during the period $t_1$ to $t_2$, there is a "pulse compression" effect due to the microwave network.

The cavities 18 and 19 may be fine tuned to resonance or completely detuned by means of screws 49 which when tuned may be used to carry end plates 51 to points which cause the respective cavities to resonate or be detuned. In the case where the cavities are detuned, klystron energy bypasses the cavities 18 and 19 and is coupled directly from the input waveguide 28 to the output waveguide 30 without significant degradation of pulse shape or energy. Such detuning would be convenient where a wide pulse width is sometimes required, in which cases the phase shifter 32 also would be bypassed.

Figure 4:
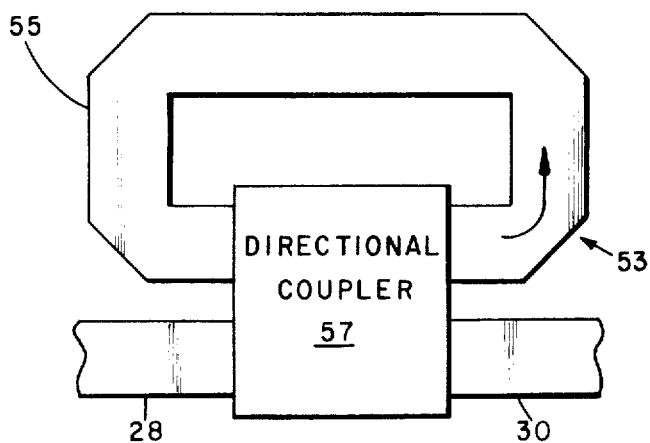
FIG. 4 is a schematic diagram of a resonant ring that may be used in place of the cavities of FIG. 2.
Figure 5:
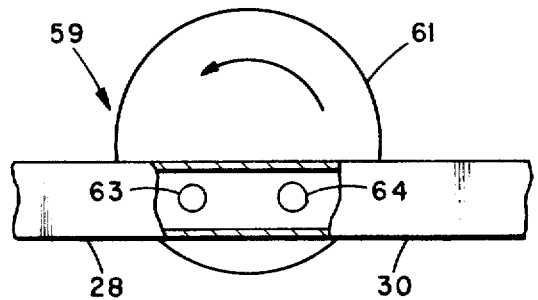
FIG. 5 is a schematic diagram of a cylindrical cavity that may be used in place of the cavities of FIG. 2.
Figure 6:
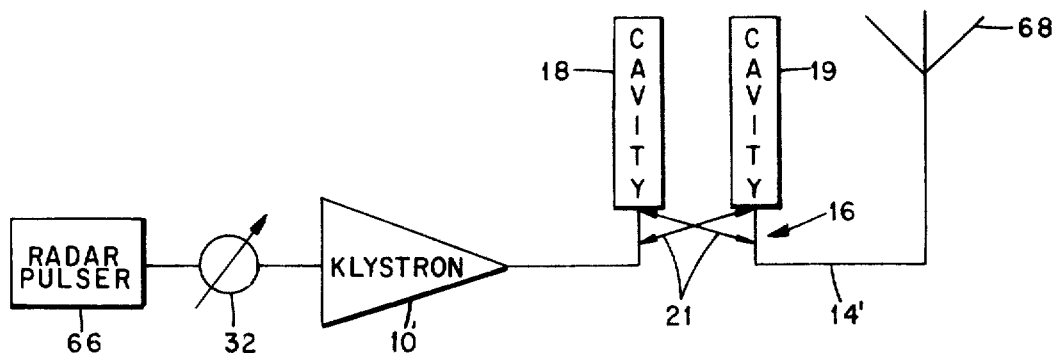
FIG. 6 is a schematic diagram of the arrangement of FIG. 2 adapted to be a RADAR transmitter.

An alternative to the arrangement 16 (FIG. 2) is an arrangement 53 shown in FIG. 4. The arrangement 53 includes a resonant ring 55 that may be coupled to the input and output waveguides 28 and 30 by means of a directional coupler 57. The ring 55 is made to be resonant at the frequency of the klystron 10' for operation similar to that described for the arrangement 16 (FIG. 1) wherein a compressed pulse of high peak energy is transmitted through the waveguide 30 upon reversal of phase of the klystron. The same effect may be obtained with still another alternative arrangement, arrangement 59 (FIG. 5), which includes a cylindrical cavity 61 coupled to the input and output waveguides 28 and 30 through apertures 63 and 64, respectively. By the use of two or more such coupling holes, appropriately spaced, a rotating mode is set up. For example, a $TM_{110}$ mode in a cylindrical cavity acts like a resonant ring that is collapsed in radius with the center wall removed.

Another use of the instant invention is to increase the peak power of a radar transmitter. By insertion of the pulser 32, klystron 10', and the arrangement 16 including the cavities 18 and 19 and directional coupler 21, between a radar pulser 66 and radar antenna 68, the peak power of pulses from the pulser 66 to the antenna 68 over waveguide 14' may be increased by compressing the pulses in the same manner as described hereinbefore with respect to the accelerator 12.

While embodiments of the invention have been shown and described, further embodiments or combinations of those described herein will be apparent to those skilled in the art without departing from the spirit of the invention.

What we claim is:

1. A radio frequency peak power multiplier for multiplying the peak power of a radio frequency source for application to a load, comprising:
    an input waveguide for receiving radio frequency input power;
    an output waveguide for delivering radio frequency output power;
    passive means coupled to said input waveguide for storing said input power, said means being operable upon cessation of the input power for delivering peak power to said output waveguide at a higher level than the input power to said input waveguide;
    a radio frequency power source operable to emit voltage fields of first and second polarities, said power source being coupled to said input waveguide for storing power from said power source in said passive means; and
    means for reversing the polarity of the voltage field from said power source for combination with the voltage fields from said passive means to produce peak power in said output waveguide that is at a higher level than the power from said power source.

2. The power multiplier of claim 1, wherein said passive means includes first and second resonant cavities, a 3 db directional coupler having first, second, third and fourth arms, said first arm being coupled to said input waveguide, said second arm being coupled to said first resonant cavity, said third arm being coupled to said second resonant cavity, and said fourth arm being coupled to said output waveguide.

3. The power multiplier of claim 1, wherein said power source is a klystron.

4. The power multiplier of claim 1, further including a load coupled to said output waveguide, said load being a linear accelerator.

5. The power multiplier of claim 1, wherein the peak power in said output waveguide is in the limit 9 times the peak power emitted from said power source.

6. The power multiplier of claim 1, further including a load coupled to said output waveguide, said load being a radar antenna.

7. The power multiplier of claim 2, further including means for detuning said cavities to decouple said cavities from said input and output waveguides to enable direct conduction of energy from said input waveguide to said output waveguide.

* * * * *